(12) United States Patent
Krishnan et al.

(10) Patent No.: US 8,093,921 B2
(45) Date of Patent: Jan. 10, 2012

(54) MONITORING OF INTERCONNECT RELIABILITY USING A PROGRAMMABLE DEVICE

(75) Inventors: Nandakumar Krishnan, San Jose, CA (US); Xinli Gu, San Jose, CA (US); Li Li, San Jose, CA (US); Jie Xue, San Jose, CA (US); Jonathan M. Parlan, San Jose, CA (US)

(73) Assignee: Cisco Technology, Inc., San Jose, CA (US)

( * ) Notice: Subject to any disclaimer, the term of this patent is extended or adjusted under 35 U.S.C. 154(b) by 111 days.

(21) Appl. No.: 12/370,607

(22) Filed: Feb. 13, 2009

(65) Prior Publication Data

US 2010/0207649 A1    Aug. 19, 2010

(51) Int. Cl.
*G01R 31/304*    (2006.01)
*G01R 31/02*    (2006.01)
(52) U.S. Cl. .................................. 324/763.01; 324/537
(58) Field of Classification Search .................... None
See application file for complete search history.

(56) References Cited

U.S. PATENT DOCUMENTS

| | | | | |
|---|---|---|---|---|
| 3,746,973 | A * | 7/1973 | McMahon, Jr. | 324/538 |
| 4,509,008 | A * | 4/1985 | DasGupta et al. | 714/731 |
| 5,070,296 | A * | 12/1991 | Priebe | 324/73.1 |
| 5,416,409 | A * | 5/1995 | Hunter | 324/750.3 |
| 5,448,164 | A * | 9/1995 | Selley et al. | 324/750.02 |
| 5,610,530 | A * | 3/1997 | Whetsel | 324/763 |
| 5,621,312 | A * | 4/1997 | Achor et al. | 324/750.06 |
| 6,725,404 | B1 * | 4/2004 | Choudhury et al. | 714/724 |
| 6,807,505 | B2 * | 10/2004 | De Jong et al. | 702/118 |
| 2006/0153186 | A1 | 7/2006 | Bector | |

OTHER PUBLICATIONS

Load Splitting IP Multicast Traffic over ECMP, Cisco, Feb. 27, 2007 available on the Web at http://www.cisco.com/en/US/docs/ios/ipmulti/configuration/guide/imc_load_splt_ecmp.pdf.

* cited by examiner

*Primary Examiner* — Vinh Nguyen
(74) *Attorney, Agent, or Firm* — Charles E. Krueger

(57) ABSTRACT

In one embodiment, the reliability of the L2 power and/or ground sub-arrays of contacts of a functional integrated circuit device is verified by applying a reference voltage to a selected contact in sub-array and sequentially measuring the voltage at other contacts in the sub-array. If the voltage levels are greater than a threshold voltage level then the functional integrated circuit device is verified as being reliable.

8 Claims, 5 Drawing Sheets

| Comparator Output (b0b1b2b3) | Resistance change (%Δr) |
|---|---|
| 0000 | No change in resistance |
| 1000 | <= 25% change |
| 1100 | <= 50% change |
| 1110 | <= 75% change |
| 1111 | Fully Open |

| Comparator Output (b0b1b2b3) | Resistance change (%Δr) |
|---|---|
| 0000 | No change in resistance |
| 1000 | <= 10% change |
| 1100 | <= 20% change |
| 1110 | <= 30% change |
| 1111 | > 30% change (Considered FAIL) |

MONITORING OF INTERCONNECT RELIABILITY USING A PROGRAMMABLE DEVICE

TECHNICAL FIELD

The present disclosure relates generally to monitoring and testing interconnect reliability.

BACKGROUND OF THE INVENTION

Integrated circuits (ICs) are fabricated on wafers of silicon. Various structures, such as ball grid arrays (BGAs) or wire frames, are utilized to connect the microcircuits fabricated on the silicon to the metallic traces on a printed circuit board (PCB) to form an IC package.

The interconnect circuitry of a IC package is a complicated physical structure that must be tested for reliability prior to verification of the IC package. Testing is usually performed on a sample set of the manufactured IC packages and if a statistically significant number of samples are found to be reliable then the IC package is verified.

One technique of testing IC package reliability is to manufacture specially configured IC packages having metallization traces bridging package substrate traces to create electrical connections between pairs of BGA balls or wire frames. Such specially created IC packages are known as daisy-chained devices.

The daisy-chained device can be tested utilizing an Automatic Electrical Tester (ATE) to verify the reliability of the IC package.

DESCRIPTION OF EXAMPLE EMBODIMENTS

Overview

In an example embodiment, a first voltage signal at a first voltage level is applied to a first contact included in a first array of contacts being part of a power or ground net, with the contacts adapted to form electrical connections between a functional integrated circuit (IC) package and a printed circuit board (PCB).

The first and second voltage levels output at contacts in the first array other than the first contact are sequentially measured and the first and second voltage levels are compared to a threshold voltage level.

The reliability of the first array of the functional IC package is verified if the first and second voltage levels are greater than the threshold voltage level.

Description

Reference will now be made in detail to various embodiments of the invention. Examples of these embodiments are illustrated in the accompanying drawings. While the invention will be described in conjunction with these embodiments, it will be understood that it is not intended to limit the invention to any embodiment. On the contrary, it is intended to cover alternatives, modifications, and equivalents as may be included within the spirit and scope of the invention as defined by the appended claims. In the following description, numerous specific details are set forth in order to provide a thorough understanding of the various embodiments. However, the present invention may be practiced without some or all of these specific details. In other instances, well known process operations have not been described in detail in order not to unnecessarily obscure the present invention. Further, each appearance of the phrase an "example embodiment" at various places in the specification does not necessarily refer to the same example embodiment.

Figure 1:
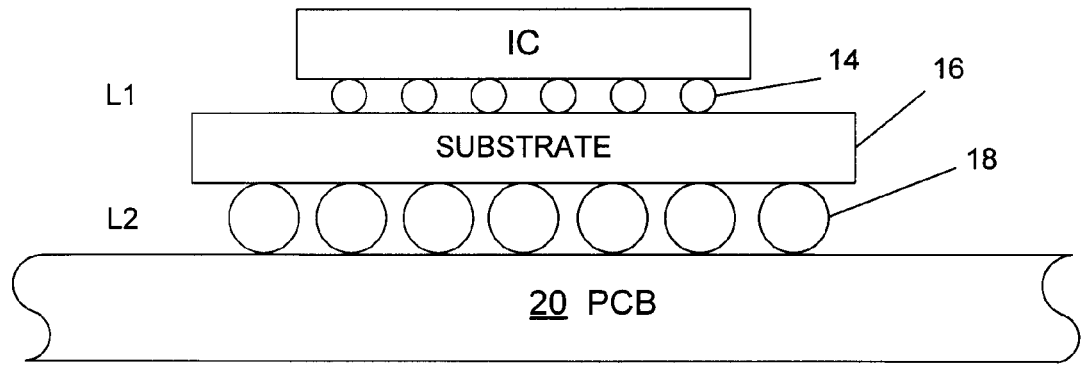
FIG. 1 illustrates an example of an IC package and Level 1 and Level 2 Ball Grid Arrays.

FIG. 1 depicts an example of a BGA IC package for packaging an IC 12. A Level 1 (L1) bump 14 is formed on the lower surface of the IC 12 and is utilized to connect micro-circuits on the IC 12 to a substrate 16. A Level 2 (L2) BGA 18 is utilized to couple the substrate 16 to the metallic traces of a PCB 20.

As is known in the art, interconnections between a device and a lower layer are formed by heating the BGA to cause melting which forms ohmic connections between the device and the lower layer. The L2 interconnections are formed during assembly of IC packages on a PCB.

Special techniques are available to test the reliability of the I/O interconnect of standard functional parts. For example, a device may include a JTAG port that permits testing of I/O interconnects.

An example embodiment will now be described that does not require a specially configured daisy-chained device to monitor and test interconnect reliability to the power and ground nets. A standard functional device is utilized for the interconnect reliability test.

Figure 2:
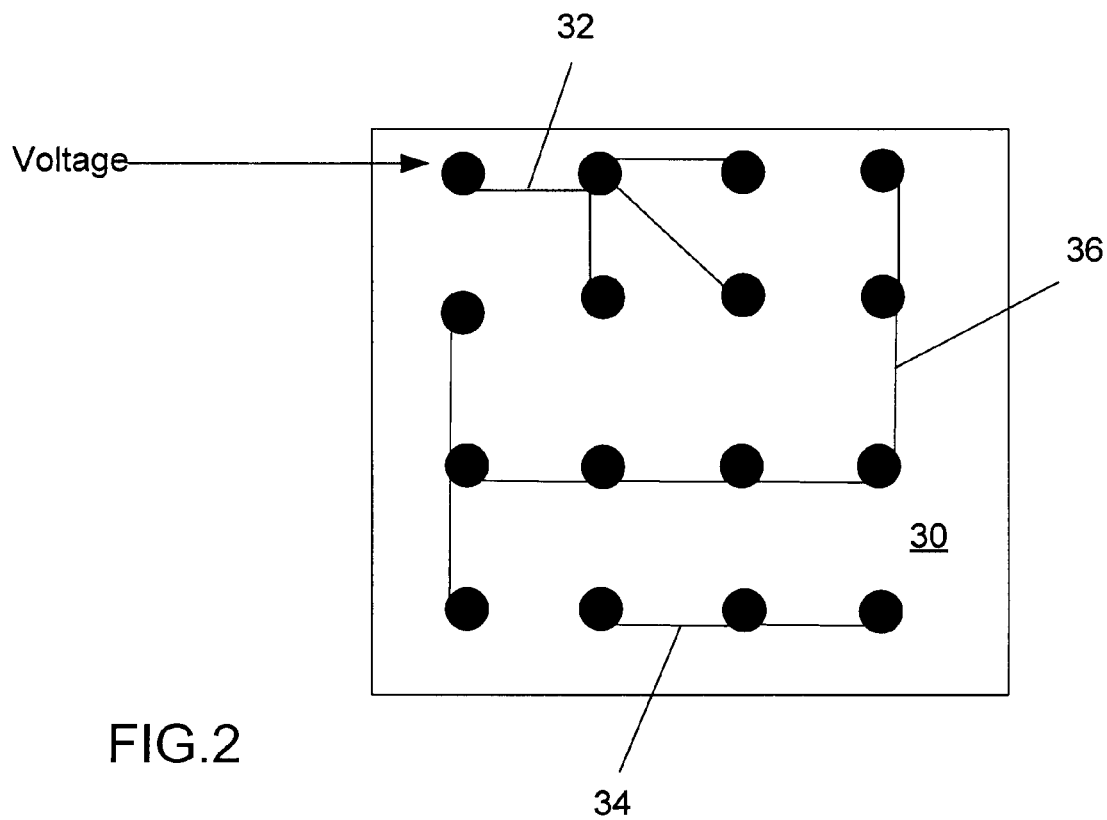
FIG. 2 illustrates an example of power, ground, and I/O nets in an IC package.

FIG. 2 schematically depicts sub-arrays of contacts included in the power and ground nets located on the outer edges of the die where the stress is high and the propensity of interconnect failure is high.

In FIG. 2, the BGA 30 of a functional IC package includes a power pin net (VCC_Core) 32, ground pin net (GND) 34 and I/O pin net (VCC_I/O) 36. No daisy-chain or other special testing hardware is built into the IC package.

During testing of the power pin net 32, a reference voltage (Vref) is applied to one contact and the voltage drop is precisely measured on the other contacts of the net. Problems with the contacts, such as cracks or other structural defects, result in a change of the resistance path between a contact coupled to Vref and a contact being tested. Thus, because the change of resistance is tied to a change in voltage drop by Ohm's law, the reliability of the IC package for different applications may be determined by measuring the amplitudes of the voltage drops at the various contacts in the net.

For example, IC packages for use on PCBs included in critical high-availability equipment might tolerate only a 10% voltage drop across the net while IC packages for use on boards included in non-critical equipment might tolerate a 15% voltage drop across the net.

Figure 3:
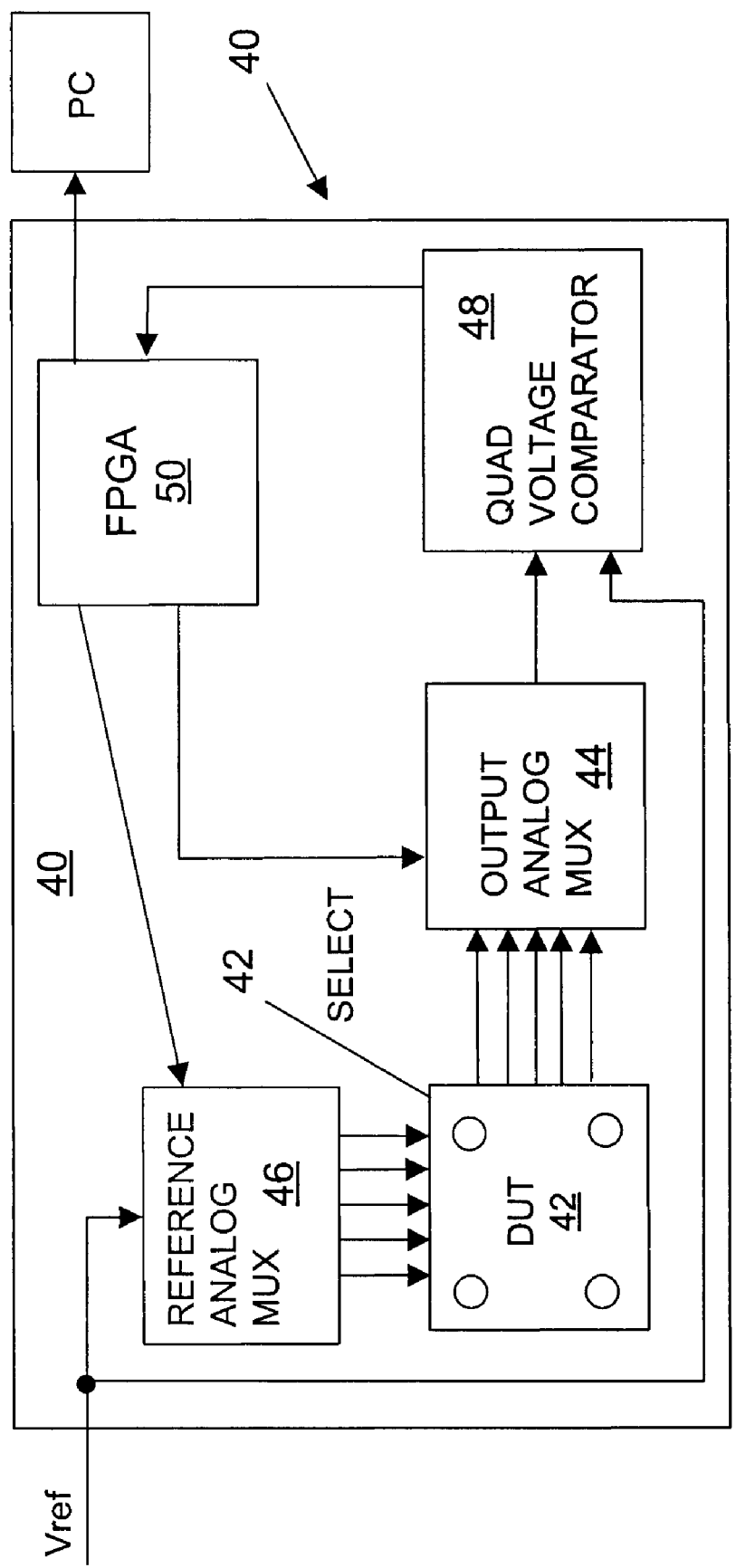
FIG. 3 illustrates a block diagram of an example embodiment.

FIG. 3 depicts a block diagram of an example embodiment. The device under test (DUT) is functional IC package 42 is mounted on a test PCB 40 and the L2 BGA of the IC package is connected to traces on the test PCB 40.

An Output Analog MUX 44 has its inputs coupled to a selected sub-array of the balls in the BGA of the DUT via the traces on the test PCB 40. The Output Analog MUX also includes a control input and an output.

A Reference Analog MUX 46 has its outputs coupled to the selected sub-array of the balls in the L2 BGA of the DUT via the traces on the test PCB 40. The Reference Analog MUX 46 also includes a control input and an input coupled to a voltage reference (Vref).

A Quad Voltage Comparator 48 has a first input coupled to the output of the Output Analog MUX 44 and a second input coupled to Vref. The Quad Voltage Comparator has a digital output.

A Field Programmable Gate Array (FPGA) 50 has a first output coupled to the control input of the Output Analog MUX 44, a second output coupled to the control input of the Reference Analog MUX 46, an input coupled to the digital output of the Quad Voltage Comparator 48 and a pass/fail signal output.

The operation of the example embodiment depicted in FIG. 3 to test a power net for reliability will now be described with reference to the flow chart of FIG. 4. The FPGA 50 controls the Reference Analog MUX 46 to apply Vref to a selected power pin. In this example embodiment, ground nets are treated as a voltage net. Since the functional IC package being tested is connected to traces on a PCB in a non-functional mode, the reference voltage can be applied to any one pin as a reference and the output monitored on the other BGA balls connected to the same net.

The FPGA 50 controls the Output Analog MUX 44 to selectively couple the output voltage from each power pin to the Quad Voltage Comparator 48 and the voltage levels output from the Quad Voltage Comparator 48 are monitored at the FPGA 50 to determine the Pass/Fail status of the power net.

In one embodiment the output voltage levels are compared to a threshold voltage level and the reliability of the power net is verified if the output voltage levels are greater than the threshold voltage level.

Selecting the multiple contacts in the power and ground nets one contact at a time is accomplished through the logic programmed into the FPGA. In addition, within a single power net, choosing different reference pins one at a time allows gathering more data on the location of a break or other defect.

Figure 5:
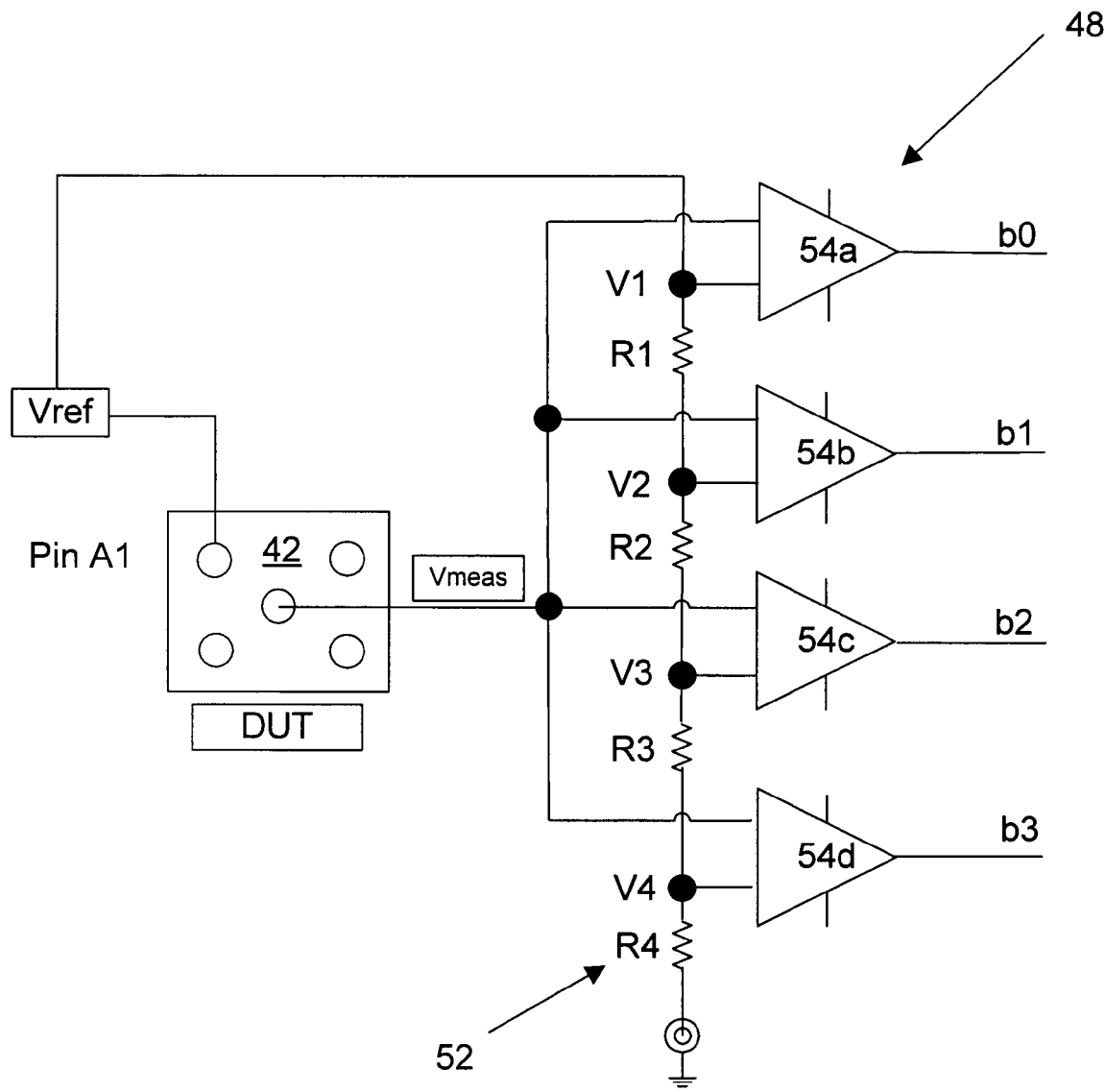
FIG. 5 illustrates a circuit diagram of an example Quad Voltage Comparator.

FIG. 5 depicts an example embodiment of the Quad Voltage Comparator 48. The reference voltage is coupled to a series chain of resistors 52. The voltage drop over each resistor is applied to the first input of a respective comparator in a series of comparators 54a-54d and the measured voltage from a selected contact is applied to the second input of each comparator 54a-54d. The outputs of the comparators (b0, b1, b2, b3) form a digital representation of the voltage drop occurring between the contact connected to Vref and the contact coupled to the Quad Voltage Comparator.

Figure 4:
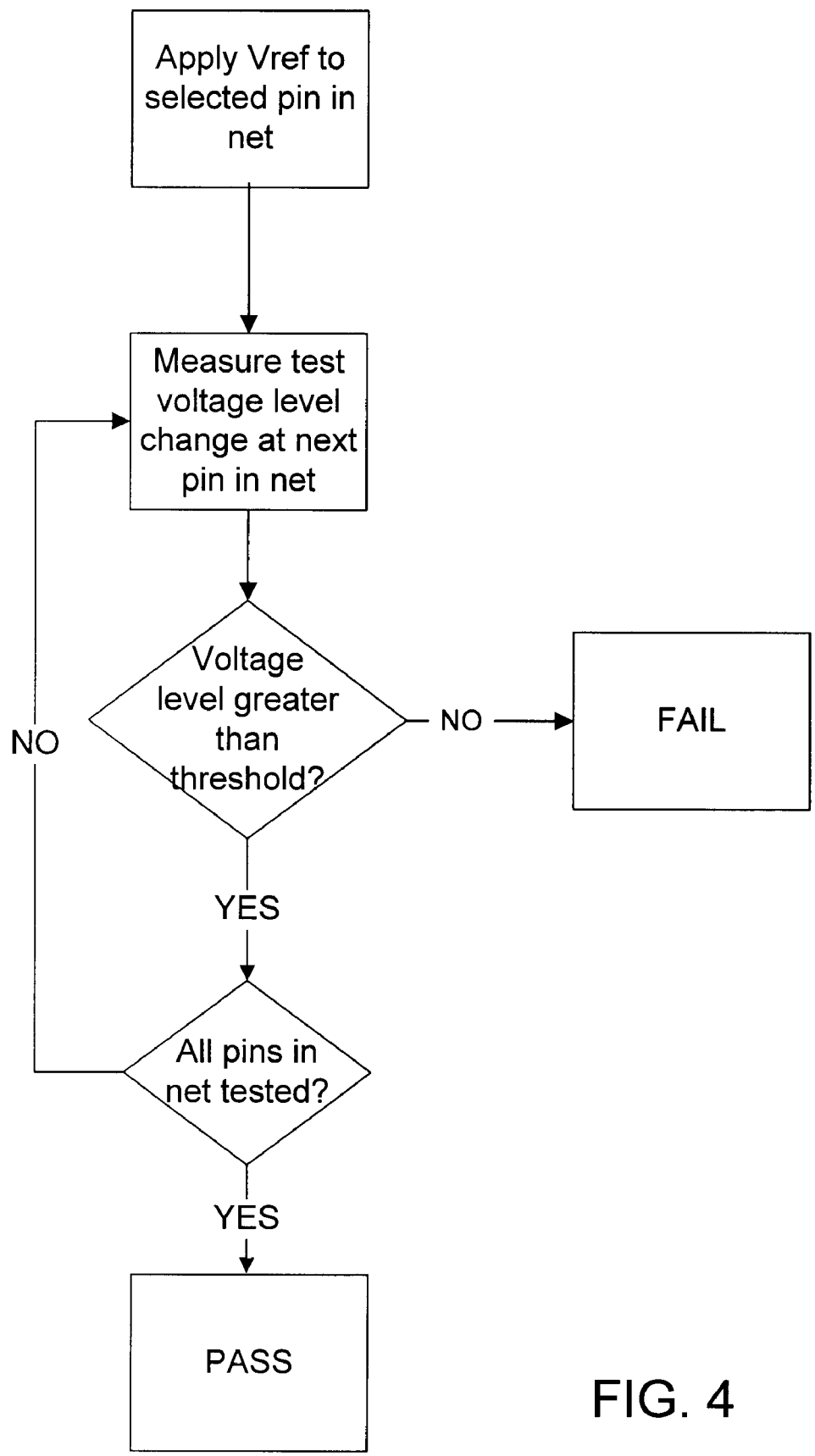
FIG. 4 illustrates a flow chart describing an example embodiment.

As is known in the art, the algorithm depicted in FIG. 4 can be implemented as logic in the FPGA utilizing a hardware description language.

Figures 6A, 6B, 7:
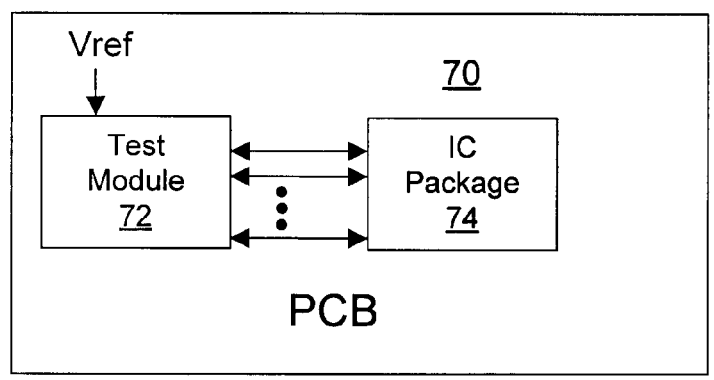
FIGS. 6A and 6B illustrate truth tables for example Quad Voltage Comparators.
FIG. 7 illustrates a block diagram of another example embodiment.

The values of the resistors determine the resolution of the Quad Voltage Comparator. For example, if R1=R2=R3=R4 then the resolution is 25% of the value of Vref. FIG. 6A is a truth table depicting the outputs of the comparators for Vref=2.4 volts.

A Quad Voltage Comparator with 10% minimum sensitivity and 10% resolution can be implemented with the following resistance values: R1=10; R2=10; R3=10; and R4=70. FIG. 6B is a truth table for this configuration.

Accordingly, as depicted in FIGS. 6A and 6B, the output of the Quad Voltage Comparator indicates the voltage drop as a fractional value of the reference voltage amplitude.

Another example embodiment is depicted in FIG. 7. In FIG. 7 a PCB 70 for use in a product is depicted. The PCB 70 has a test module 72 and at least one IC package 74 mounted thereon. The test module in this example embodiment includes the Reference and Output Analog MUXes, Quad Voltage Comparator, and FPGA depicted in FIG. 3. The inputs of the Output Analog MUX and the outputs of the Reference Analog MUX are coupled to the pins of the power and ground nets of an IC package 74.

The operation of the example embodiment depicted in FIG. 7 will now be described. If the PCB 70 malfunctions the test module 52 tests the power and ground net interconnects as described above with reference to FIG. 4. If the test fails then the problem has been diagnosed as a failure of the L2 ball array.

Existing methods of testing a malfunctioning PCB include X-raying the board to image the interconnects. However, X-raying can detect only physical damage such as cracks in the ohmic connection although failures of the interconnect may be due to subtle effects that can not be imaged by X-rays. Another technique of testing is to remove the IC package from the board to perform diagnostic tests. However, the act of removal destroys the evidence relating to interconnect failure as the possible source of the malfunction.

The invention has now been described with reference to the example embodiments. Alternatives and substitutions will now be apparent to persons of skill in the art. For example, the Reference Analog MUX may be omitted if it is not required to apply Vref to different pins in a net. Also, other techniques for determining the value of the measured voltage may be utilized. Further, control devices other than an FPGA, such as a programmed microprocessor, may be utilized. Accordingly, it is not intended to limit the invention except as provided by the appended claims.

What is claimed is:

1. An apparatus comprising:
 a test board adapted to couple at least a sub-array of contacts of a functional integrated circuit package to metallic traces on a printed circuit board with a first contact adapted to be coupled to a reference voltage signal at a reference voltage level;
 a first multiplexer having a plurality of inputs coupled to the sub-array of contacts via metallic traces, an output, and a control input adapted to receive a control signal that controls the first multiplexer to couple a selected input to the output;
 a voltage comparator circuit having a first input adapted to receive the reference voltage signal, a second input coupled to the output of the first multiplexer and an output adapted to provide a digital representation encoding the amplitude of a voltage level at a contact coupled to the output of the first multiplexer; and
 a programmable device having a first output coupled to the control input of the first multiplexer, a first input coupled to the output of the voltage comparator circuit, and a second output, with the programmable device configured to output first and second control signals at its first output to control the first multiplexer to sequentially couple second and third contacts to the first input of the voltage comparator circuit and to output a pass signal at the second output if the amplitude of a received voltage level is greater than a threshold voltage level.

2. The apparatus of claim 1 further comprising:
a second multiplexer having a plurality of outputs coupled to the sub-array of contacts via metallic traces, an input adapted to receive the reference voltage signal and a control input adapted to receive a control signal that controls the second multiplexer to couple a selected output to the input; and
with the programmable device having a third output further configured to output second multiplexer control signals at the third output to couple the reference voltage to selected contacts in the sub-array.

3. The apparatus of claim 1 where the voltage comparator comprises:
a first resistor having an input terminal coupled to receive the reference voltage and an output terminal;
a first comparator having a first input coupled to the output of the first multiplexer and having a second input coupled to the input terminal; and
a second comparator having a first input coupled to the output of the first multiplexer and having a second input coupled to the output terminal.

4. A method comprising:
applying a first input voltage signal at a first input voltage level to a selected contact included in a first array of interconnected contacts being part of a power or ground net, with the contacts adapted to form electrical connections between a functional integrated circuit (IC) package and a printed circuit board (PCB);
forming representations of first and second voltage drop amplitudes between the selected contact and two other contacts in the first array of interconnected contacts different from the selected contact, with the two other contacts in the array different from the selected contact included in the power net if the selected contact is included in the power net, with the two other contacts in the array different from the selected contact included in the ground net if the selected contact is included in the ground net; and
indicating reliability of the first array of the functional IC package based on comparing the first and second voltage drop amplitudes to a threshold voltage level.

5. The method of claim 4 further comprising:
applying the first input voltage signal to a second input contact in the first array that is different from the selected contact;
forming representations of third and fourth voltage drop amplitudes between the contact that is different from the selected contact and two other contacts in the first array different from the contact to which voltage is applied, with the two other contacts different from the contact to which voltage is applied included in the power net if the contact different than the selected contact is included in the power net, with the two other contacts different from the contact to which voltage is applied included in the ground net if the contact different from the selected contact is included in the ground net; and
indicating reliability of the first array of the functional IC package based on comparing the amplitudes of the third and fourth voltage drop amplitudes to the threshold voltage level.

6. An apparatus comprising:
means for applying a first input voltage signal at a first input voltage level to a selected contact included in a first array of interconnected contacts being part of a power or ground net, with the contacts adapted to form electrical connections between a functional integrated circuit (IC) package and a printed circuit board (PCB);
means for forming representations of first and second voltage drop amplitudes between the selected contact and two other contacts in the first array of interconnected contacts different from the selected contact, with the two other contacts in the array different from the selected contacts included in the power net if the selected contact is included in the power net, with the two other contacts in the array different from the selected contact included in the ground net if the selected contact is included in the ground net; and
means for indicating reliability of the first array of the functional IC package based on comparing the amplitudes of the first and second voltage drop amplitudes to a threshold voltage level.

7. The apparatus of claim 6 further comprising:
applying the first input voltage signal to a contact in the first array that is different from the selected contact;
means for forming representations of third and fourth voltage drop amplitudes between the contact that is different from the selected contact and two other contacts in the first array different from the contact to which voltage is applied, with the two other contacts different from the contact to which voltage is applied included in the power net if the contact different than the selected contact is included in the power net, with the two other contacts different from the contact to which voltage is applied included in the ground net if the contact different from the selected contact is included in the ground net; and
means for indicating reliability of the first array of the functional IC package based on comparing the amplitudes of the third and fourth voltage drop amplitudes to the threshold voltage level.

8. A Field Programmable Gate Array encoded to perform the following operations:
output a first control signal to control a first multiplexer to apply a first input voltage signal at a first input voltage level to a selected contact included in a first array of interconnected contacts being part of a power or ground net, with the contacts adapted to form electrical connections between a functional integrated circuit (IC) package and a printed circuit board (PCB);
output a second and a third control signal to control an output analog multiplexer to couple two other contacts in the first array different from the selected contact to a voltage comparator to form representations of first and second voltage drop amplitudes between the selected contact and the two other contacts in the first array different from the selected contact, with the two other contacts in the first array different from the selected contact included in the power net if the selected contact is included in the power net, with the two other contacts in the first array different from the selected contact included in the ground net if the selected contact is included in the ground net; and
output a verification signal to indicate reliability of the first array of the functional IC package based on comparing the first and second voltage drop amplitudes to a threshold voltage level.

* * * * *